United States Patent [19]
Lamacraft et al.

[11] Patent Number: 5,153,533
[45] Date of Patent: Oct. 6, 1992

[54] VOLTAGE CONTROLLED OSCILLATOR

[75] Inventors: Kevin Lamacraft, Wembley; Kenneth Elder, Northwood, both of England; Christopher D. Howson, Strasbourg, France

[73] Assignee: GPT Ltd., United Kingdom

[21] Appl. No.: 713,794

[22] Filed: Jun. 12, 1991

[30] Foreign Application Priority Data

Jun. 20, 1990 [GB] United Kingdom ............... 9013762

[51] Int. Cl.⁵ .............................................. H03B 7/14
[52] U.S. Cl. ............................... 331/107 SL; 331/96; 331/107 G; 331/177 V
[58] Field of Search ............ 331/96, 99, 101, 107 SL, 331/107 C, 107 G, 107 T, 117 D, 177 V

[56] References Cited

U.S. PATENT DOCUMENTS

| | | | |
|---|---|---|---|
| 3,996,529 | 12/1976 | Curtice | 331/107 G X |
| 4,574,256 | 3/1986 | Singh | 331/107 SL |
| 4,906,947 | 3/1990 | Hart et al. | 331/107 G X |

FOREIGN PATENT DOCUMENTS 56-91510 7/1981 Japan.
1329002 9/1973 United Kingdom.

OTHER PUBLICATIONS

Quine, J. P., "An LSA-Mode Transferred-Electron-Diode Oscillator for Microstrip"; *Proc. IEEE*; Aug. 1970; pp. 1291-1292.

*Primary Examiner*—David Mis
*Attorney, Agent, or Firm*—Kirschstein, Ottinger, Israel & Schiffmiller

[57] ABSTRACT

A voltage-controlled oscillator using planar microstrip technology and primarily for the 37 to 39.5 GHz frequency band comprises a strip-line resonator, a negative resistance device mounted adjacent the center of the resonator, respective variable capacitance devices mounted adjacent the ends of the resonator, a high impedance coupling the resonator to an output path, and bias signals are applied to the negative resistance device and said variable capacitance devices.

10 Claims, 1 Drawing Sheet

VOLTAGE CONTROLLED OSCILLATOR

BACKGROUND OF THE INVENTION

The present invention relates to voltage-controlled oscillators.

In particular, although not exclusively, the invention is concerned with broadband voltage-controlled oscillators for electronically settable channel selection for radio transmission systems operating in the 37 to 39.5 GHz frequency band. Such oscillators need to be designed to have a tuning bandwidth of, say, 2 GHz, to allow for production tolerances, to cover an upper or lower half-band of 1.25 GHz bandwidth.

SUMMARY OF THE INVENTION

According to one aspect of the present invention a voltage-controlled oscillator comprises a strip-line resonator, a negative resistance device mounted adjacent the centre of said resonator, respective variable capacitance devices mounted adjacent the ends of said resonator, high impedance means coupling said resonator to an output path, and means to apply bias signals to said negative resistance device and to said variable capacitance devices.

According to another aspect of the present invention a strip-line oscillator for operation at wavelengths of the order of millimetres comprises a length of strip-line, a negative resistance device mounted adjacent the centre of said length of strip-line, respective variable capacitance devices mounted adjacent the ends of said length of strip-line, high impedance means coupling said length of strip-line to an output path, and means to apply bias signals to said negative resistance device and to said variable capacitance devices.

BRIEF DESCRIPTION OF THE DRAWINGS

A voltage controlled oscillator in accordance with the present invention will now be described with reference to the accompanying drawing of which.

DETAILED DESCRIPTION OF THE PREFERRED EMBODIMENT

Figure 1:
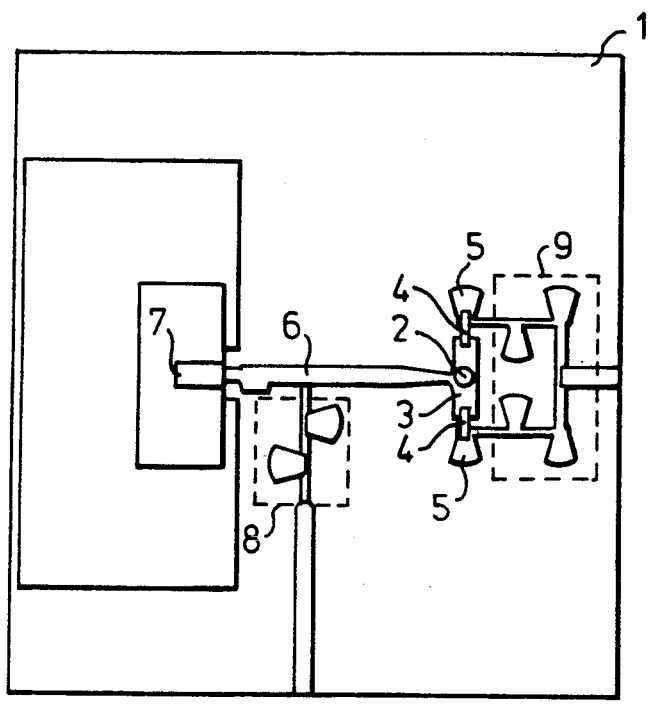
FIG. 1 shows diagrammatically a plan view of the oscillator.

Referring to the drawing the oscillator, for operation in the frequency band from 37 GHz to 39.5 GHz, is formed in microstrip on a glass fibre reinforced PTFE substrate 1 which may be 0.25 mm thick, with continuous sheet metallization on its underside forming a ground plane and metallization in strip-line form on its upper surface defining the circuit elements of the oscillator. The metallization is each case may comprise 17.5 microns of copper covered by 5 microns of gold.

The oscillator comprises a negative resistance device 2, in the present case a Gunn diode, which is connected underneath the substrate 1 such that the top cap of the diode is flush with the upper metallization, and a resonant circuit comprising a centre strip 3, a pair of varactor diodes 4 and a pair of 30 degree radial stubs 5. Power is coupled out of the resonant circuit by way of a high impedance tap 6 and is launched into an output waveguide (not shown) by way of a printed E-plane transition 7.

A bias current for the Gunn diode 2 is applied by way of a band-stop filter 8, and a control signal voltage for the variable capacitance varactor diodes 4 is applied by way of a pair of band-stop filters 9.

The Gunn diode 2, operating with a bias current of several amps, may exhibit a resistance of the order of minus ten ohms, and the resonant circuit is arranged to present a positive resistance of the same order, the centre strip 3 being 1 mm wide and 3.17 mm long and the stubs 5 constituting low-Q quarter wave stubs.

Figure 2:
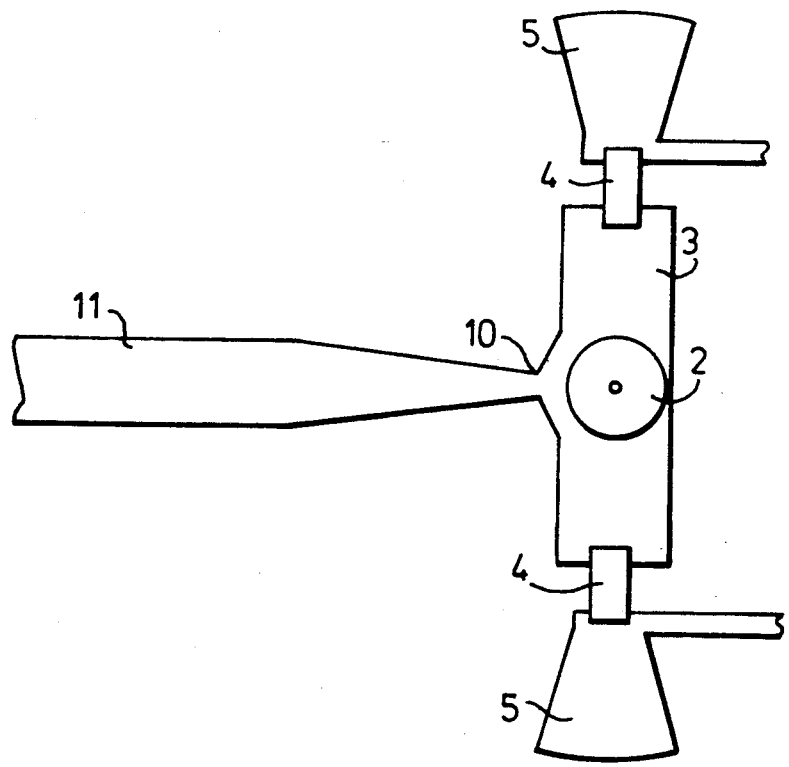
FIG. 2 shows part of FIG. 1 on a larger scale.

Referring particularly to FIG. 2, the high impedance tap 6 tapers to a narrow entry 10 from a strip-line output conductor 11, the entry 10 being some 0.2 mm wide and having a characteristic impedance of some 100–120 ohms and the conductor 11 being 0.75 m wide and having a characteristic impedance of 50 ohms. It will be appreciated therefore that the tap 6 presents to the resonant circuit an impedance an order of magnitude higher than the impedance of the resonant circuit.

The strip-line conductors of the bandstop filters 8 and 9 are also some 0.2 mm wide, while the quarter wave stubs of these filters are high-Q 90 degree stubs.

We claim:

1. A broad band, tunable, voltage-controlled oscillator comprising: a strip-line resonator having a center and opposite ends, a negative resistance device mounted adjacent the center of said resonator, a pair of variable capacitance tuning devices respectively mounted in series with the ends of said resonator, high impedance means coupling said resonator to an output path, means for applying a direct current bias signal to said negative resistance device via said output path, and means for applying direct current bias signals to said variable capacitance devices to vary their capacitance and tune the oscillator over a tuning bandwidth of at least two GHz.

2. An oscillator as claimed in claim 1 wherein the negative resistance device comprises a Gunn diode.

3. An oscillator as claimed in claim 1, wherein the bias signal for said negative resistance device is applied by way of a band-stop filter.

4. An oscillator as claimed in claim 1, wherein the bias signals for said variable capacitance devices are applied by way of respective band-stop filters.

5. An oscillator as claimed in claim 1, wherein the high impedance means is connected into an output waveguide by way of an E-plane transition.

6. A strip-line oscillator for broad band operation at wavelengths of the order of millimetres comprising: a length of strip-line having a center and opposite ends, a negative resistance device mounted adjacent the center of said length of strip-line, a pair of variable capacitance tuning devices respectively mounted in series with the ends of said length of strip-line, high impedance means coupling said length of strip-line to an output path, means for applying a direct current bias signal to said negative resistance device via said output path, and means for applying direct current bias signals to said variable capacitance devices to vary their capacitance and tune the oscillator over a tuning bandwidth of at least two GHz.

7. An oscillator as claimed in claim 6 wherein the negative resistance device comprises a Gunn diode.

8. An oscillator as claimed in claim 6 wherein the bias signal for said negative resistance device is applied by way of a band-stop filter.

9. An oscillator as claimed in claim 6 wherein the bias signals for said variable capacitance devices are applied by way of respective band-stop filters.

10. An oscillator as claimed in claim 6 wherein the high impedance means is connected into an output waveguide by way of an E-plane transition.

* * * * *